US012736491B2

(12) United States Patent
Chen

(10) Patent No.: US 12,736,491 B2
(45) Date of Patent: Sep. 15, 2026

(54) THERMAL RESISTANCE DETERMINATION

(71) Applicant: Hewlett-Packard Development Company, L.P., Spring, TX (US)

(72) Inventor: Fu-Yi Chen, Taipei City (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 261 days.

(21) Appl. No.: 18/698,502

(22) PCT Filed: Oct. 25, 2021

(86) PCT No.: PCT/US2021/056422
§ 371 (c)(1),
(2) Date: Apr. 4, 2024

(87) PCT Pub. No.: WO2023/075743
PCT Pub. Date: May 4, 2023

(65) Prior Publication Data

US 2025/0237623 A1 Jul. 24, 2025

(51) Int. Cl.
*G01N 25/18* (2006.01)
*G01K 3/14* (2006.01)
(Continued)

(52) U.S. Cl.
CPC ............... *G01N 25/18* (2013.01); *G01K 3/14* (2013.01); *G08B 21/182* (2013.01); *G06F 1/206* (2013.01); *H05K 7/20209* (2013.01)

(58) Field of Classification Search
CPC ............ G01N 25/18; G01K 3/14; G01K 3/10; G01K 17/00; G08B 21/182; H05K 7/20209; G06F 1/206
See application file for complete search history.

(56) References Cited

U.S. PATENT DOCUMENTS

2014/0245032 A1* 8/2014 Vadakkanmaruveedu .................. G06F 1/324 713/300
2016/0062422 A1 3/2016 Mittal et al.
(Continued)

FOREIGN PATENT DOCUMENTS

| | | | |
|---|---|---|---|
| CN | 106802387 | A | 6/2017 |
| JP | 2018-169919 | A | 11/2018 |
| WO | 2018/147839 | A1 | 8/2018 |

OTHER PUBLICATIONS

Computer translation of CN_106802387_A (Year: 2026).*
Computer translation of JP_2018169919_A (Year: 2026).*

*Primary Examiner* — Randy W Gibson
(74) *Attorney, Agent, or Firm* — Quarles & Brady LLP

(57) ABSTRACT

In an example, an electronic device includes an electronic component with a temperature sensor to measure a first operating temperature of the electronic component at a first operating state having a first power value; and measure a second operating temperature of the electronic component at a second operating state having a second power value. The electronic device includes a controller to determine a first delta between the first operating temperature and an ambient temperature and determine a second delta between the second operating temperature and the ambient temperature. The controller is to determine a thermal resistance value and provide a notification when difference between a target thermal resistance value and the thermal resistance value exceeds a threshold.

20 Claims, 4 Drawing Sheets

(51) Int. Cl.

| | |
|---|---|
| ***G08B 21/18*** | (2006.01) |
| *G06F 1/20* | (2006.01) |
| *H05K 7/20* | (2006.01) |

(56) References Cited

U.S. PATENT DOCUMENTS

2021/0263820 A1 8/2021 Berke
2025/0321181 A1 * 10/2025 Seida .................. G01N 17/008

* cited by examiner

THERMAL RESISTANCE DETERMINATION

BACKGROUND

Electronic devices include laptop computers, tablets, desktop computers, mobile phones, etc. that transmit or modify energy to perform, or assist in the performance of tasks. Electronic devices may include various components that generate heat during operation of the electronic device. Examples of components that generate heat include integrated circuit chips (IC)s, central processing units (CPU)s, graphical processing units (GPU)s, and power sources, among other types of heat-generating components.

Electronic devices may include a fan. A fan is utilized to produce a flow within a fluid. For instance, a fan causes air to be drawn into an electronic device, circulate the air within the electronic device, and expel the air from the electronic device to cool the electronic device.

DETAILED DESCRIPTION

Figure 1:
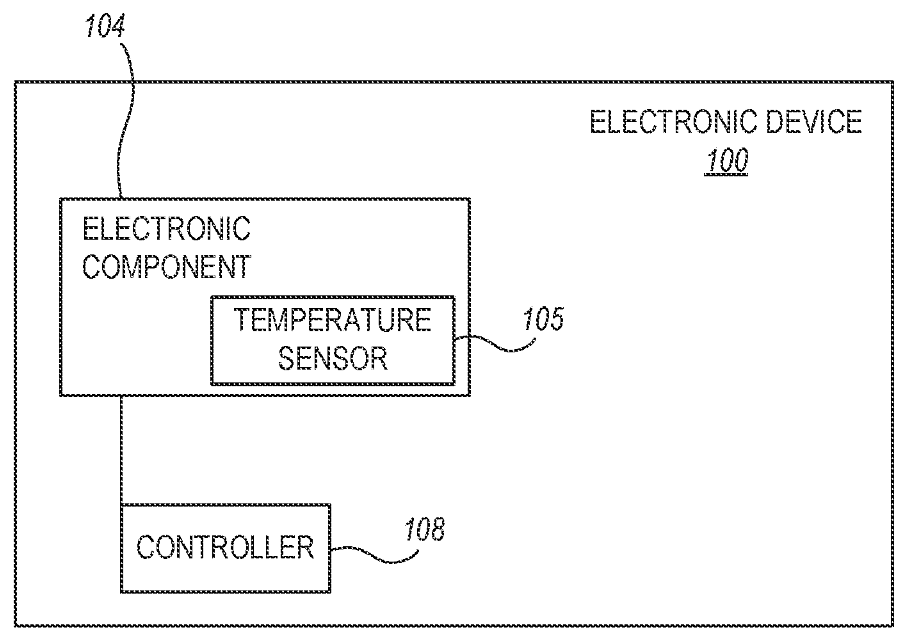
FIG. 1 illustrates an example of an electronic device including an electronic component with a temperature sensor suitable with thermal resistance determination.

Electronic devices generate heat in the process of transmitting or modifying energy to perform or assist in tasks. For example, as electricity passes through wires and across circuitry in the electronic device, inherent resistance in the wires and circuitry causes ohmic heating in the system, thereby producing heat.

Various methodologies of mitigating heat in electronic devices are employed. For example, fans are utilized in electronic devices to mitigate heat. As used herein, “fan” is a device that operates to produce flow within a fluid (e.g., air). For instance, the fan intakes air from an environment surrounding the electronic devices via an air intake in a housing of the electronic device and thereby permits the cooler ambient air to reduce an internal temperature (inside of the housing) of the electronic device.

However, over time electronic components inside of the electronic device such as a heat-sink and/or other type of electronic component may become covered with particulates. Examples of particulates include dust particles in air, powder used in industrial equipment, shavings from milling or grinding equipment, biological materials (such as hair, skin cells, pollen, and other biological matter shed by plants and animals), and so forth. For instance, over time a heat-sink is covered with particulates and therefore may exhibit a reduction in heat-transfer capability of the heat-sink (e.g., due to insulative properties of the particulates). Similarly, over time an air intake of the electronic device become covered with and/or clogged with particulates such as dust and thereby reduce an amount of ambient air available to cool the electronic device. As such, the thermal performance of a cooling system (e.g., a heat sink, an air inlet, etc.) may be impacted by the presence of such particulates. That is, an increase in particulates leads to a decrease in cooling, of the electronic thus higher operating temperatures of the electronic device.

Higher operating temperatures in some instances result in a negative experience for an end user of the electronic device. Moreover, accumulation of particulates in an electronic device may pose risks to an environment around the electronic device, to humans who are using or in the proximity of the electronic device, and/or to the electronic device itself. Examples of risks to an electronic device caused by particulates include mechanical erosion or failure, chemical corrosion, electrical shorting, failure, or damage caused by over-heating, or other risks. Examples of risks to humans in the proximity of the electronic device include electric shock from catastrophic failure of a voltage electronic device due to over temperature events, exposure of humans to undesirable levels of particulates, and so forth.

As such, various approaches seek to determine when an electronic device is experiencing a reduction in cooling capability as a result of the presence of particulates. For instance, some approaches periodically take a given temperature of an electrical component in an electronic device and compare it to a base temperature. However, such approaches do not account for variations in electronic device cooling systems such as variations between different types of electronic device (e.g., differences in heat sink type/size/location, differences in air vent type/size/location, etc.). Moreover, such approaches do not account for differences in utilization of an electronic component (e.g. a graphics card, a central processing unit, a graphics processing unit, etc.) during operation of the electronic device. Due to not accounting for variations between different devices and/or variations in utilization of an electronic component such approaches do not provide sufficient accuracy to readily determine when thermal performance of an electronic device has degraded to a level to warrant an intervention (e.g., notifying a user to clean vents/air intake of an electronic device and/or request service from a manufacturer and/or point of sale of the electronic device).

Accordingly, approaches herein are directed to thermal resistance determination, as detailed herein. Notably, thermal resistance determination accounts for variations between different devices and/or variations in utilization of an electronic component, and thus readily identifies when an intervention is warranted. When an intervention is warranted a notification (e.g., to clean or replace the air filter, clean an air vent, clean a given component such as a heat-sink, etc.) are provided.

FIG. 1 illustrates an example of an electronic device 100 including an electronic component 104 with a temperature sensor 105 for thermal resistance determination. The electronic device 100, in some instances, includes additional component such as a controller 108 (i.e., thermal management controller), among other components as described herein.

The electronic device 100 may be a mobile phone, a tablet, a laptop computer, a desktop computer, or combinations thereof, among other possible types of electronic devices. In some examples, the electronic device 100 is an all-in-one (AIO) computer. As used herein, an AIO computer refers to a computer which integrates the internal components into the same case as a display member and offers the touch input functionality of the tablet devices while also providing the processing power and viewing area of desktop computing systems.

The electronic component 104 refers to a component and/or a portion of a component that is disposed inside of the electronic device 100. Examples of the electronic component 104 include a central processing unit (CPU), a graphics processing unit (GPU), a solid-state drive, a hard-drive, a graphics card, or any combination thereof. For instance, in sonic examples the electronic component is a CPU. However, in sonic examples the electronic component 104 is a CPU, among other possibilities.

Figure 2:
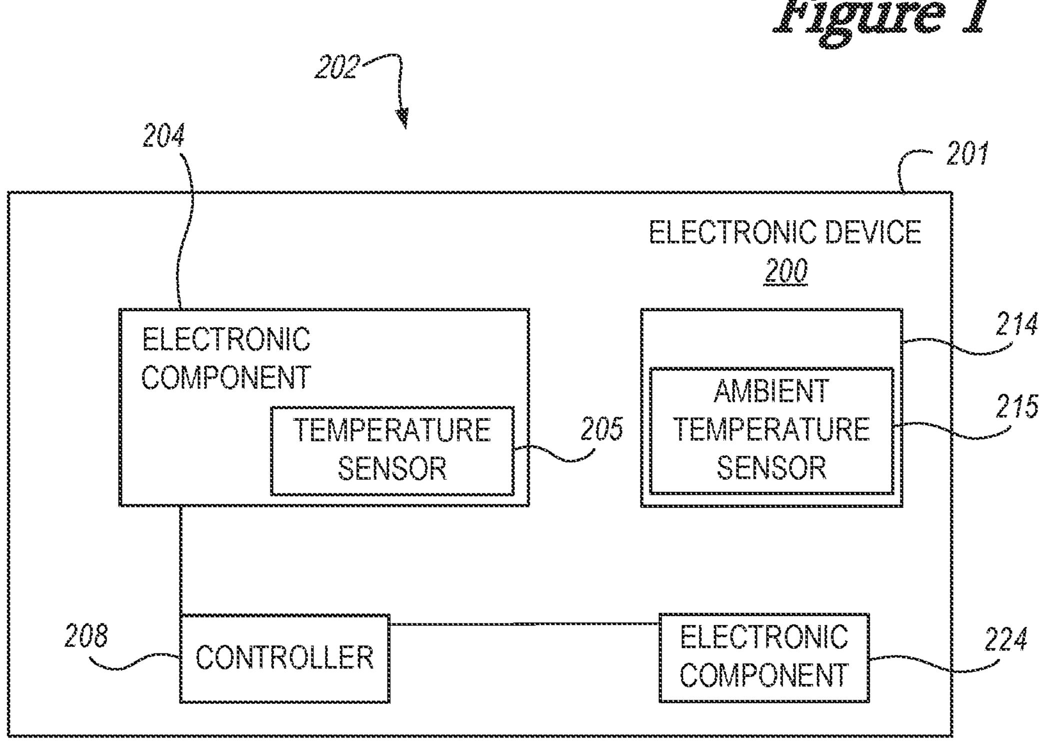
FIG. 2 illustrates an example system including an electronic component with a temperature sensor suitable with thermal resistance determination.

The electronic component 104 includes a temperature sensor 105. Examples of suitable temperature sensors include a thermistor, a thermocouple, a resistance thermometer, a silicon bandgap temperature sensor, or any combination thereof. The temperature sensor in various instances is integral with the electronic component 104. For instance, the temperature sensor 105 in some instances is integral with a first electronic component (e.g., a first electronic component 204 as illustrated in FIG. 2) of a plurality of electrical components.

As used herein, a temperature sensor being "integral" with an electronic component refers to the temperature sensor being disposed on or within the electronic component. Stated differently, removal of the electronic component 104 from the electronic device 100 would inherently result in removal of the temperature sensor 105 from the electronic device. In this way, an internal operating temperature of the electronic component 104 is readily identified in a manner that is less susceptible to interference from particulate matter and/or is more reliable at measuring a temperature of a particular component than other approaches which employ separate and distinct temperature sensors intended to measure an internal temperature of air but not a particular component within an electronic device.

In some instance, the temperature sensor 105 measures a first operating temperature of the electronic component at a first operating state and a second operating temperature of the electronic component at a second operating state. As used herein, "an operating state" refers to state of an electronic component 104 and/or the electronic device 100 during a session of use of the electronic device 100 by a user, such as during load-testing or other operation of the electronic device 100. Similarly, the "operating temperature" refers to a temperature sensor value obtained during a session of use of the electronic device 100 by a user.

As detailed herein, the controller 108 is to determine a first delta (i.e., difference) between the first operating temperature and an ambient temperature and determine a second delta between the second operating temperature and the ambient temperature. The ambient temperature and be approximated (e.g., assumed to be a given temperature) or in some instances the electronic device 100 include an ambient temperature sensor to determine an ambient temperature, as detailed herein. In any case, the controller 108 determines a thermal resistance value based on the first delta and the second delta.

Table 1 provides example values for thermal resistance determination.

TABLE 1

| Power (%) | Power (W) | Ambient Temperature (° C.) | Component Temperature (° C.) | Delta (° C.) |
|---|---|---|---|---|
| 20 | 30 | 29 | 43 | 14 |
| 40 | 60 | 29 | 56 | 30 |
| 60 | 90 | 30 | 68 | 43 |
| 80 | 110 | 30 | 78 | 48 |
| 100 | 125 | 30 | 89 | 59 |

As used herein, "Power (%)" refers to a percent of an amount of input power supplied by a voltage regulator, a power supply, etc. to the electronic component. As used herein, "Power (W)" refers to a quantity in Watts (W) of an amount of input power supplied by a voltage regulator, a power supply, etc. to the electronic component. As used herein, "Ambient Temperature (° C.)" refers to an ambient temperature measured in degrees Celsius (° C.) by an ambient temperature sensor (e.g., ambient temperature sensor 215 as illustrated in FIG. 2) of the electronic device. As used herein, a "Component Temperature (° C.)" refers to a temperature (° C.) as measured by the temperature sensor 105. As used herein, "Delta (° C.)" refers to a difference in degrees Celsius (° C.) between the Component Temperature and the Ambient Temperature.

In various instances, the temperature sensor 105 determines a plurality of operating temperatures (e.g., 43° C., 56° C., 68° C., 78° C., and 89° C., as indicated in Table 1). The plurality of operating temperatures are determined for a plurality of respective operating states (e.g., 20%, 40%, 60%, 80%, or 100% power consumed by an electronic component). In some instances, the first operating state (e.g., with a power value of 20%/30 W) corresponds to less than 100 percent of the total amount of power available to the electronic component and the second operating state corresponds to 100 percent of the total amount of power available to the electronic component.

While described in Table 1 as having a total of 5 operating states and corresponding temperature the total quantity of operating states can be varied (e.g., permitting increasing or decreasing a total quantity of operating states). For instance, less than 5 total operating states such as a total of four operating states, a total of three operating states, or a total of two operating states are used in some instances. Notably, employing a plurality of operating states to determine thermal resistance accounts for variations between different devices and/or variations in utilization of an electronic component, and thus readily identifies when an intervention is warranted, in contrast to other approaches that merely attempt to compare a given temperature to a base temperature value.

For instance, the temperature sensor 105 measures a first operating temperature (e.g., 43° C.) of the electronic component 104 at a first operating state (e.g., 20% power/30 W) and measures a second operating temperature (e.g., 89° C.) of the electronic component at a second operating state (e.g., 100% power/125 W).

The controller 108 receives the first operating temperature and the second operating temperature from the temperature sensor 105. In some instances, the controller 108 receives an ambient temperature from an ambient temperature sensor, as detailed herein. The ambient temperature is measured at the same or similar time as the respective operation temperature is measured to permit accurate determination of a delta between the operating temperature and the ambient temperature at a particular operating state (e.g. a particular amount of power consumed by the electronic component 104). That is, any variation in ambient temperature is accounted for by measuring the ambient temperature at the same or similar time as the operating temperature is measured.

The controller 108 determines a first delta (e.g., 14° C.) between the first operating temperature and an ambient temperature (e.g., 29° C.) and similarly the controller 108 determines a second delta (e.g., 59° C.) between the second operating temperature and the ambient temperature (e.g., 30° C.).

Figure 5:
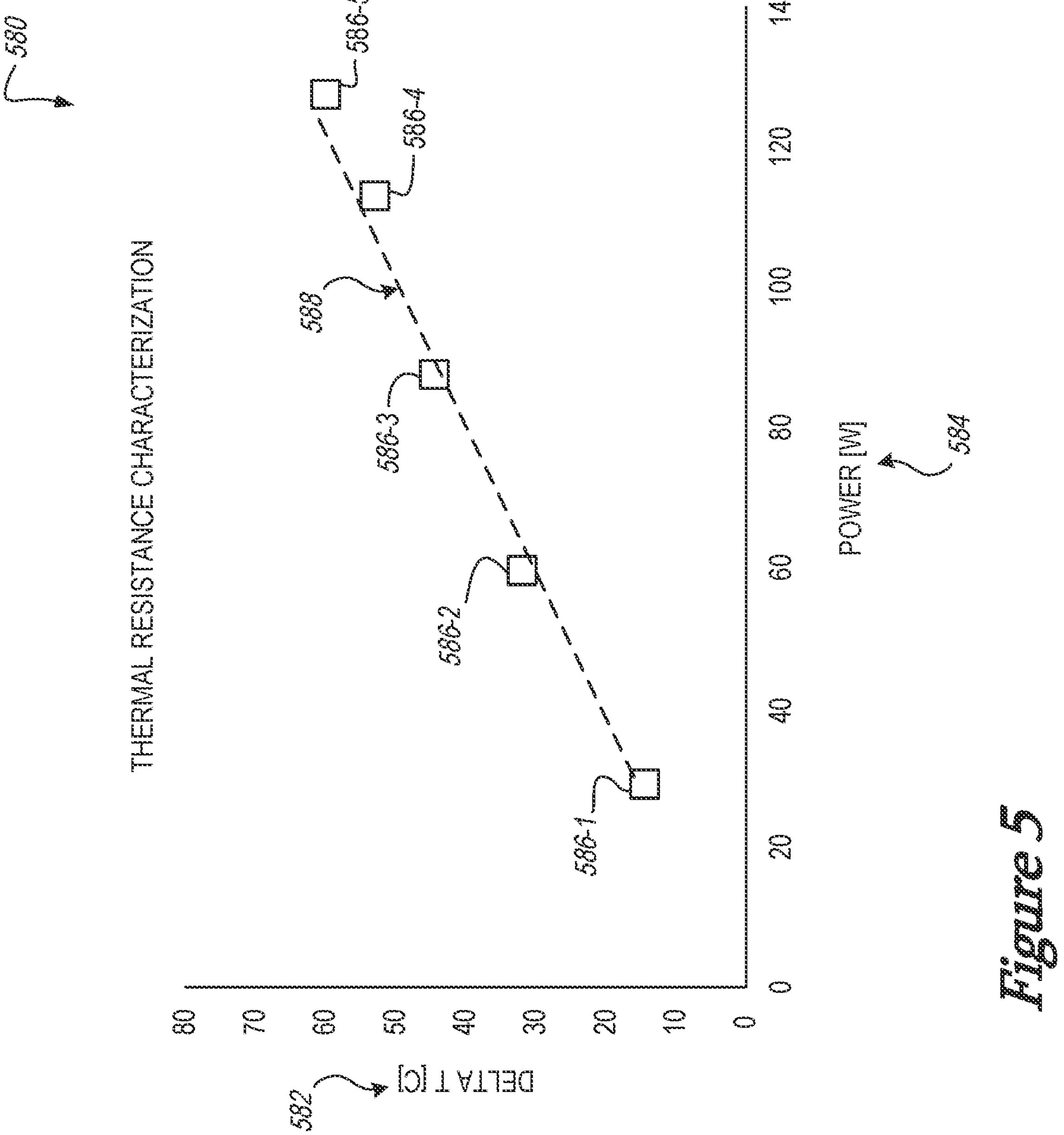
FIG. 5 illustrates a graph of an example of thermal resistance determination.

The controller 108 determines a thermal resistance value based on the first delta and the second delta. In some instances, the controller 108 determines a thermal resistance value as a ratio of a difference between the second delta and the first delta and a difference between the second operating state and the first operating state. Stated differently, a thermal resistance value (e.g., ~0.47° V/W) is determined as a difference (e.g., 45° C.) between the second delta (59° C.) and the first delta (14° C.) is divided by a difference (e.g., 95 W) between the second operating state (125 W) and the first operating state (30 W). However, in some instances, a thermal resistance value (e.g., 0.52° C./W as illustrated in FIG. 5) resistance value that is equal to a slope of a trend line on a graph associated with a plurality of points corresponding to a plurality of deltas temperature values and a plurality of values of power consumption associated with a plurality of operation states, as described in FIG. 5. Determining the thermal resistance values as a value equal to the slope of a trend line on the graph of delta temperature versus power consumption values of an electronic component, as detailed in FIG. 5, provides enhanced accuracy and/or accounts for variations at different operational states of the electronic component 104.

The controller 108 provides a notification when the difference between a target thermal resistance value and the thermal resistance value exceeds a threshold. The notification in some instances is a notification to perform a cleaning procedure to clean the electronic device. For instance, the notification, in some instances, is a notification to clean the air filter and/or to replace an air filter system including the air filter, a notification to clean an air intake, a notification to clean a component (e.g., a heat-sink), a notification to reduce an ambient temperature (e.g., in instances the determined ambient temperature is above an ambient temperature threshold), among other possible notifications. The notification, in some instances, is provided via a display of an electronic device (e.g., laptop) housing the temperature (thermal) sensor. In this manner, a user of the electronic device is notified, among other possibilities.

In response to the notification, a user performs an action (e.g., cleaning an air intake) and provides an input to the electronic device 100 that the action is completed. The controller 108 then measures additional (new) operating temperatures at a plurality of operating states. So doing permits determination of a new thermal resistance value. The new thermal resistance value and is compared to the target thermal resistance value.

Notably, the target thermal resistance value remains fixed. For instance, the target thermal resistance value is stored in a non-volatile memory (not illustrated) of the electronic device 100. In some instances, the target thermal resistance value is fixed value that is determined based on testing at a point of manufacture of the electronic device. In this way, the target thermal resistance value is associated with operation of the electronic device before the electronic device is exposed to particulates during operation of the electronic device by an end-user.

As mentioned, the new thermal resistance value (determined after a cleaning operation is performed) is compared to the target thermal resistance value. An additional notification is provided when a difference between a target thermal resistance value and the new thermal resistance value exceeds the thermal resistance threshold. The additional notification (e.g., a second type of notification) is available to notify that a user is to contact a manufacturer, supplier, or other entity that provides additional services to the electronic device 100. Conversely, when a thermal resistance value (or a subsequently determined "new" thermal resistance value) is less than or equal to the thermal resistance threshold a notification is not provided, or a notification is provided that the electronic device is within suitable thermal operations parameters.

FIG. 2 illustrates an example system 202 including an electronic device 200 with an electronic component 204 with a temperature sensor 205 suitable with thermal resistance determination. The system 202 includes a controller 208 that is analogous or similar to controller 108 and/or controller 308, as described in FIGS. 1 and 3, respectively.

As illustrated in FIG. 2, the electronic device 200 includes a housing 201. The housing 201 form an exterior surface of the electronic device 100. The housing 201 is formed of fabric, metal, wood, plastic, or combinations thereof, among other suitable materials. The housing 201 includes an air inlet 214. The air inlet 214 permits air to flow into a volume defined by the housing 201.

An ambient temperature sensor 215 is disposed in the air inlet 214 in a path of the air flowing through the air inlet 214. Example of suitable ambient temperature sensors include a thermistor, a thermocouple, a resistance thermometer, a silicon bandgap temperature sensor, or any combination thereof. Having the ambient temperature sensor 215 be disposed in the air inlet 214 enhances accuracy of the ambient temperate determination. However, in some examples the ambient temperature sensor 215 is disposed elsewhere on the electronic device 200.

As illustrated in FIG. 2, the electronic device includes a first electronic component 204 having a temperature sensor 205 and a second electronic component 224. That is, as illustrated in FIG. 2, the first electronic component 204 having the temperature sensor 205 (e.g., a GPU) is a separate and distinct component from the second electronic component (e.g., a CPU). However, in some examples the first electronic component and the second electronic component are the same electronic component.

Figure 3:
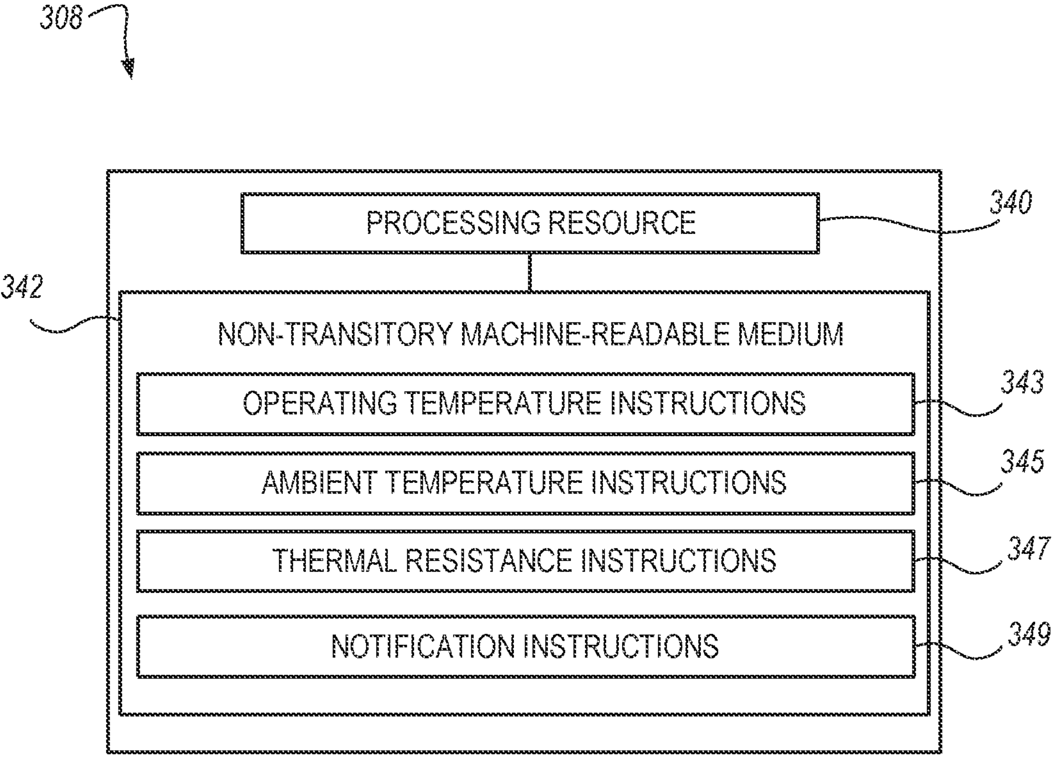
FIG. 3 illustrates a diagram of an example of a controller suitable with thermal resistance determination.

FIG. 3 illustrates a diagram of an example of a controller 308 suitable with thermal resistance determination. As illustrated in FIG. 3, the controller 308 includes a processing resource 340 and a non-transitory computer readable medium 342.

The processing resource 340 is a central processing unit (CPU), a semiconductor based microprocessor, and/or other hardware devices suitable for retrieval and execution of machine-readable instructions such as those stored on the non-transitory computer readable medium 342. The term "non-transitory" does not encompass transitory propagating; signals.

The non-transitory computer readable medium 342 is any electronic, magnetic, optical, or other physical storage device that stores executable instructions. Thus, non-transitory computer readable medium 342 is, for example, Random Access Memory (RAM), an Electrically-Erasable Programmable Read-Only Memory (EEPROM), a storage drive, an optical disc, and the like.

The executable instructions, in some instances, are “installed” on the controller 308 illustrated in FIG. 3. Non-transitory computer readable medium 342 are a portable, external, or remote storage medium, for example, that allows the controller 308 to download instructions from the portable/external/remote storage medium. In this situation, the executable instructions are a part of an “installation package”. As described herein, non-transitory computer readable medium 342 are encoded with executable instructions related to thermal resistance determination.

The processing resource 340 executes temperature instructions 343 to receive respective signals from temperature sensors indicative of real-time operating temperatures of an electronic component (e.g., a CPU) included in an electronic device. For instance, the temperature instructions 343 are executed to receive respective operating temperature values during a session of use of an electronic device. The temperature instructions 343 are executed to periodically determine the respective operating temperature values, for instance, periodically during a session of use of the electronic device and/or periodically over an operational lifetime of an electronic device. The temperature instructions 343 are executed to measure (or cause another device such as a temperate sensor to measure) a first operating temperature of the electronic component at a first operating state and a second operating temperature of the electronic component at a second operating state, in various instances.

The processing resource 340 executes ambient temperature instructions 345 to determine an ambient temperature of an environment surrounding an electronic device. In some instances, the ambient temperature instructions 345 determine an ambient temperature at the same time or near the same time as the first temperature and/or the second temperature of the electronic component is measured. That is, the ambient temperature vanes over the session of use of the electronic device and/or over multiple sessions of use of the electronic device.

The processing resource 340 executes ambient temperature instructions 345 to determine a first delta between a first operating temperature and the ambient temperature, as detailed herein. Similarly, the processing resource 340 executes ambient temperature instructions 345 to determine a second delta between the second operating temperature and the ambient temperature, as detailed herein.

The processing resource 340 executes thermal resistance instructions 347 to determine a thermal resistance value. In various instances, the thermal resistance value is determined based on the first delta and the second delta. The thermal resistance value is indicative of an amount of accumulation of particulates on the electronic device.

The processing resource 340 executes compare instructions (not illustrated) to compare the thermal resistance value to a target thermal resistance value. The target thermal resistance value is specific to an electronic device. For instance, the target thermal resistance value is a baseline for thermal operation/cooling of the electronic device. The target thermal resistance value is determined over a training period following manufacture of the electronic device and before use of the electronic device by an end user. In some instances, the target thermal resistance value is determined in the same manner (e.g., using the same total quantity of operating states) as the thermal resistance value. As such, any variation in the thermal resistance value from the target thermal resistance value is readily identified and attributed to degradation of cooling performance (e.g., due to particulate accumulation) of the electronic device.

In some instances, each electronic component of a plurality of electronic component in an electronic device has a respective thermal resistance value determined and compared to a respective target thermal resistance value of the electronic component. For instance, respective thermal resistance values are determined and compared to respective target thermal resistance values of a CPU and a GPU included in the electronic component, in some instances.

The processing resource 340 executes notification instructions 349 to provide a notification responsive to the determination that the thermal resistance value exceeds the target thermal resistance value. In some instances, the processing resource 340 executes notification instructions 349 to provide a notification responsive to the determination that the thermal resistance value exceeds the target thermal resistance value by athermal resistance threshold (e.g., 1%, 5%, 10%, etc.). The notification is provided as an audio notification, a visual notification, a haptic notification, or any combination thereof. For instance, the notification is provided as a visual notification (e.g., text, icons, etc.) displayed by a display panel in an electronic device, such as those described herein.

The notification instructions 349 are executed to provide a plurality of different types of notification. For instance, a first type of notification advises a user to take a cleaning action to attempt to mitigate and/or resolve any particulate accumulation, while a second type of notification advises the user to cease a session of use of the electronic device, and a third type of alert advises the user to seek the assistance of a manufacture of the electronic device, among other possibilities.

Figure 4:
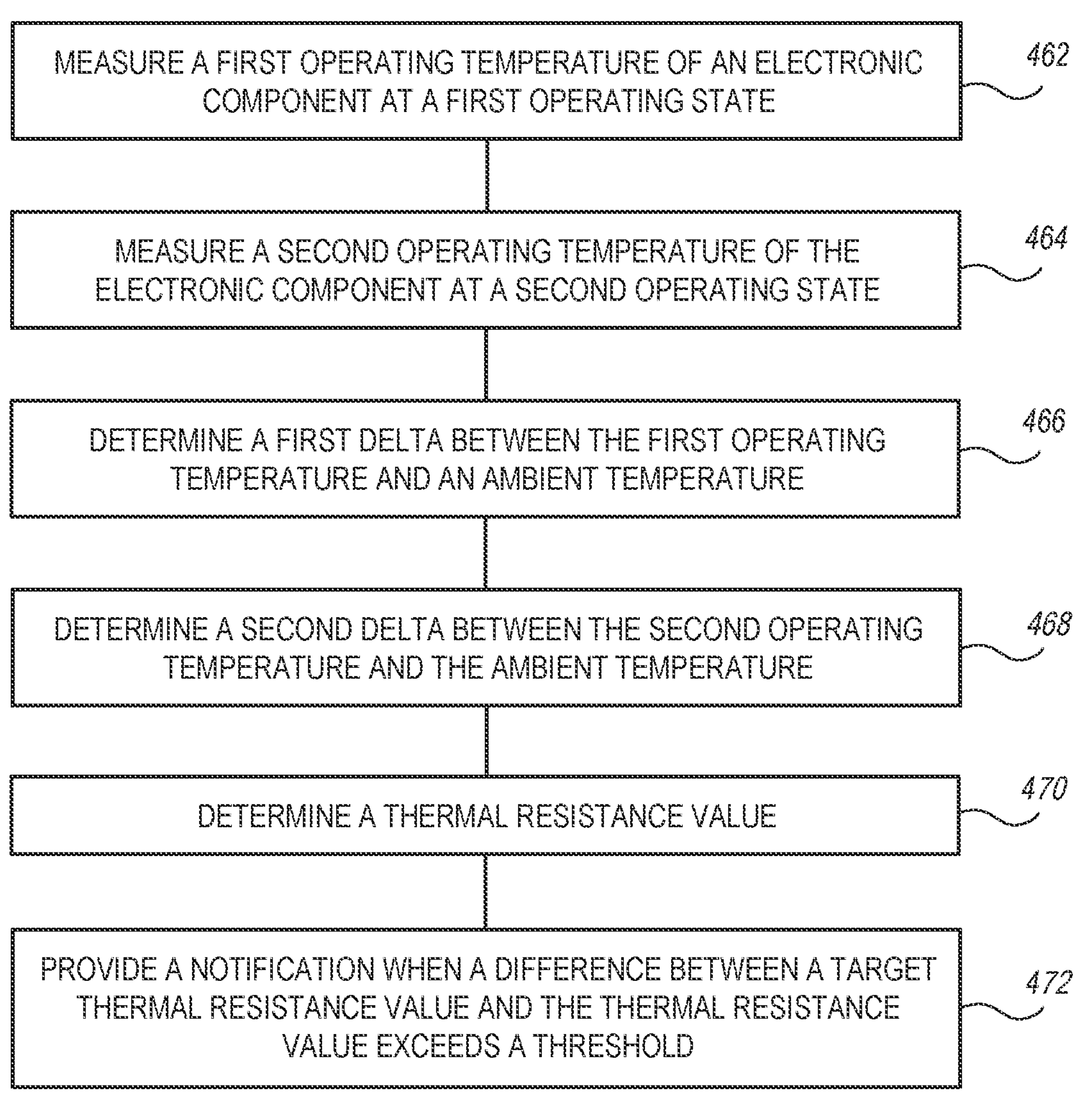
FIG. 4 illustrates a flow diagram of an example of a method suitable with thermal resistance determination.

FIG. 4 illustrates a flow diagram of an example of a method 460 suitable with a thermal resistance determination. The method 460 is performed by a controller (e.g., controller 108, 208, 308, as described in connection with FIGS. 1, 2, and 3, respectively).

At 462, the method 460 includes measuring a first operating temperature of an electronic component disposed in a housing of an electronic device. In some instances, the first operating temperature is determined while the electronic component is at a first operating state, as detailed herein. At 464, the method 460 includes measuring a second operating temperature of the electronic component. In some instances, the second operating temperature is determined while the electronic component is at a second operating state, as detailed herein. As mentioned, the first operating temperature and the second operating temperature are measured via a temperature sensor such as a temperature sensor that is integral with the electronic component.

At 466, the method 460 includes determining a first delta between a first operating temperature and an ambient temperature, as detailed herein. At 468, the method 460 includes determining a second delta between the second operating temperature and the ambient temperature, as detailed herein. As mentioned, the ambient temperature is determined by an ambient temperature sensor such as an ambient temperature sensor located in or near an air vent included in an electronic device.

At 470, the method 460 includes determining a thermal resistance value. The thermal resistance value in some instances is equal to a slope of a trend line on a graph. For example, the thermal resistance value is equal to a slope of a trend line on a graph that is associated with a first point corresponding to the second delta and the second operating state and a second point corresponding to the first delta and the first operating state, as detailed in FIG. 5.

At 472, the method 460 includes providing a notification. In some instances, the notification is provided when a difference between a target thermal resistance value and the thermal resistance value and exceeds a threshold, as detailed herein. For instance, the thermal resistance value (e.g., 0.52° C./W) is higher than the target thermal resistance value (0.45° C./W) by an amount (e.g., 0.07° C./W) that exceed the threshold (e.g., 10%) than the target thermal resistance value.

FIG. 5 illustrates a graph 580 of an example of thermal resistance determination. As illustrated in FIG. 5, the graph 580 has a first axis 582 with delta temperature values (C) and a second axis 584 with power (W) values (e.g., 30 W, 60 W, 90 W, 110 W, and 125 W, among other possible value). The graph 580 includes a total of five respective data points 586-1, 586-2, 586-3, 586-4, and 586-5 (collectively referred to herein as data points 586). The data points 586 correspond to the respective values detailed in Table 1, herein. While the graph 580 includes a total of five data points 586, the total quantity of data points is variable. In various instances, the thermal resistance value is equal to a slope of a trend line such as a slope (e.g., 0.52° C./V) of the trend line 588. As mentioned, employing a slope of a trend line such as the trend line 588 provides enhanced accuracy and/or accounts for variations at different operational states of the electronic component. The thermal resistance value (e.g., 0.52° C./W) is compared to a target thermal resistance value (e.g. 0.45° C./W). A notification, as detailed herein, is provided when a difference between the target thermal resistance value and the thermal resistance value and exceeds a threshold (e.g., 10%).

The figures herein follow a numbering convention in which the first digit corresponds to the drawing figure number and the remaining digits identify an element or component in the drawing. For example, reference numeral 106 can refer to element "06" in FIG. 1 and an analogous and/or identical element can be identified by reference numeral 406 in FIG. 4. Elements shown in the various figures herein can be added, exchanged, and/or eliminated to provide additional examples of the disclosure. In addition, the proportion and the relative scale of the elements provided in the figures are intended to illustrate the examples of the disclosure, and should not be taken in a limiting sense.

It is understood that when an element is referred to as being "on," "connected to", "coupled to", or "coupled with" another element, it can be directly on, connected to, or coupled with the other element or intervening elements can be present. "Directly" coupled or in "direct contact" refers to being connected without intervening elements. "Removably" coupled refers to a component being able to be decoupled in a predesignated manner from another component. As used herein, "logic" is an alternative or additional processing resource to execute the actions and/or functions, etc., described herein, which includes hardware (e.g., various forms of transistor logic, ASICs, etc.), as opposed to computer executable instructions (e.g., software, firmware, etc.) stored in memory and executable by a processing resource.

What is claimed is:

1. An electronic device comprising:
- an electronic component with a temperature sensor to:
  - measure a first operating temperature of the electronic component at a first operating state; and
  - measure a second operating temperature of the electronic component at a second operating state; and
- a controller to:
  - determine a first delta between the first operating temperature and an ambient temperature;
  - determine a second delta between the second operating temperature and the ambient temperature;
  - determine a thermal resistance value based on the first delta and the second delta; and
  - provide a notification when a difference between a target thermal resistance value and the thermal resistance value exceeds a threshold.

2. The electronic device of claim 1, further comprising an ambient temperature sensor to measure an ambient temperature of an environment surrounding the electronic device.

3. The electronic device of claim 2, wherein the ambient temperature sensor is a thermistor, a thermocouple, a resistance thermometer, a silicon bandgap temperature sensor, or any combination thereof.

4. The electronic device of claim 1, wherein the electronic component is a central processing unit, a graphics processing unit, a solid-state drive, a hard-drive, a graphics card, or any combination thereof.

5. The electronic device of claim 1, wherein the first operating state corresponds to a particular amount of power consumed by the electronic component of a total amount of input power available to the electronic component.

6. The electronic device of claim 5, wherein the first operating state corresponds to less than 100 percent of the total amount of power available to the electronic component and the second operating state corresponds to 100 percent of the total amount of power available to the electronic component.

7. A system comprising:
- electronic components in a housing, the electronic components including a first electronic component with a temperature sensor and a second electronic component;
- an ambient temperature sensor to determine an ambient temperature; and
- a controller to:
  - receive, from the temperature sensor, a first operating temperature of the first electronic component while the second electronic component is at a first operating state;
  - receive, from the temperature sensor, a second operating temperature of the first electronic component while the second electronic component is at a second operating state;
  - determine a first delta between the first operating temperature and the ambient temperature;
  - determine a second delta between the second operating temperature and the ambient temperature;
  - determine a thermal resistance value based on the first delta and the second delta; and
  - provide a notification when a difference between a target thermal resistance value and the thermal resistance value exceeds a threshold.

8. The system of claim 7, wherein the housing includes an air inlet and wherein the ambient temperature sensor is located in the air inlet.

9. The system of claim 7, wherein the first electronic component and the second electronic component are the same electronic component.

10. The system of claim 7, wherein the first electronic component and the second electronic component are different electronic components.

11. The system of claim 7, wherein the temperature sensor is a thermistor, a thermocouple, a resistance thermometer, a silicon bandgap temperature sensor, or any combination thereof.

12. The system of claim 7, wherein the temperature sensor is integral with the first electronic component.

13. A method comprising:

measuring, by a temperature sensor associated with an electronic component disposed in a housing of an electronic device, a first operating temperature of the electronic component while the electronic component is at a first operating state;

measuring, by the temperature sensor, a second operating temperature of the electronic component while the electronic component is at a second operating state;

determining, by a controller comprising a processing resource and a non-transitory computer-readable medium, a first delta between the first operating temperature and an ambient temperature;

determining, by the controller, a second delta between the second operating temperature and the ambient temperature;

determining, by the controller, a thermal resistance value that is equal to a slope of a trend line on a graph associated with a first point corresponding to the second delta and the second operating state and a second point corresponding to the first delta and the first operating state; and providing, by the controller, a notification when a difference between a target thermal resistance value and the thermal resistance value exceeds a threshold.

14. The method of claim 13, wherein the notification further comprises a notification to perform a cleaning procedure to clean a portion of the electronic device.

15. The method of claim 13, wherein the target thermal resistance value is a fixed value that is determined based on testing at a point of manufacture of the electronic device.

16. The method of claim 13, wherein the ambient temperature is a temperature of an environment surrounding the electronic device and is measured by an ambient temperature sensor.

17. The method of claim 16, wherein the ambient temperature sensor is a thermistor, a thermocouple, a resistance thermometer, a silicon bandgap temperature sensor, or any combination thereof.

18. The method of claim 13, wherein the electronic component is a central processing unit, a graphics processing unit, a solid-state drive, a hard-drive, a graphics card, or any combination thereof.

19. The method of claim 13, wherein the first operating state corresponds to a particular amount of power consumed by the electronic component of a total amount of input power available to the electronic component.

20. The method of claim 19, wherein the first operating state corresponds to less than 100 percent of the total amount of input power available to the electronic component and the second operating state corresponds to 100 percent of the total amount of input power available to the electronic component.

* * * * *